(12) United States Patent
Onda et al.

(10) Patent No.: US 10,718,789 B2
(45) Date of Patent: Jul. 21, 2020

(54) COMMON TEST BOARD, IP EVALUATION BOARD, AND SEMICONDUCTOR DEVICE TEST METHOD

(71) Applicant: Kabushiki Kaisha Toshiba, Minato-ku, Tokyo (JP)

(72) Inventors: Masato Onda, Kawasaki Kanagawa (JP); Seiji Sakurai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/126,566

(22) Filed: Sep. 10, 2018

(65) Prior Publication Data

US 2019/0004088 A1 Jan. 3, 2019

Related U.S. Application Data

(62) Division of application No. 14/991,747, filed on Jan. 8, 2016, now Pat. No. 10,101,359.

(30) Foreign Application Priority Data

Mar. 12, 2015 (JP) .................. 2015-049257

(51) Int. Cl.
*G01R 31/26* (2020.01)
*G01R 1/04* (2006.01)
*G01R 31/3185* (2006.01)
*G01R 31/28* (2006.01)

(52) U.S. Cl.
CPC ....... *G01R 1/0433* (2013.01); *G01R 31/2844* (2013.01); *G01R 31/318538* (2013.01)

(58) Field of Classification Search
CPC .. G01R 1/0433; G01R 1/0466; G01R 1/0483; G01R 1/06722; G01R 1/07378; G01R 1/07328; G01R 31/318538; G01R 31/31905; G01R 31/3167; G01R 31/2844; G01R 31/2889; G01R 31/2874; G01R 31/2806; G01R 31/2808
See application file for complete search history.

(56) References Cited

U.S. PATENT DOCUMENTS

| 6,762,599 | B1 * | 7/2004 | Miller | G11C 29/56 324/750.16 |
|---|---|---|---|---|
| 6,798,051 | B2 * | 9/2004 | Benedix | H01L 25/0652 257/678 |
| 6,996,757 | B2 * | 2/2006 | Evans | G01R 31/3171 714/704 |
| 2003/0057940 | A1 * | 3/2003 | Tanimura | G01R 31/31924 324/756.07 |
| 2004/0048499 | A1 | 3/2004 | Adams | |

(Continued)

FOREIGN PATENT DOCUMENTS

| JP | H08-201476 A | 8/1996 |
|---|---|---|
| JP | 2006-090953 A | 4/2006 |
| JP | 2011-220924 A | 11/2011 |

*Primary Examiner* — Thang X Le
(74) *Attorney, Agent, or Firm* — White & Case LLP (57) ABSTRACT

According to one embodiment, there is provided a common test board including a socket board, an IP evaluation board, and a common board. To the socket board, a semiconductor device is to be connected. On the IP evaluation board, the socket board is able to be attached. On the common board, the IP evaluation board is able to be attached.

14 Claims, 8 Drawing Sheets

(56) References Cited

U.S. PATENT DOCUMENTS

| | | |
|---|---|---|
| 2006/0275932 A1 | 12/2006 | Fujimura et al. |
| 2007/0184680 A1* | 8/2007 | Choi .................... G01R 1/0433 |
| | | 439/66 |
| 2008/0126863 A1* | 5/2008 | Co ......................... G11C 29/56 |
| | | 714/29 |
| 2009/0051366 A1* | 2/2009 | Miyauchi ........... G01R 31/2822 |
| | | 324/537 |
| 2009/0267628 A1 | 10/2009 | Takase |
| 2010/0216320 A1 | 8/2010 | Russell |
| 2011/0248737 A1 | 10/2011 | Takeshita et al. |
| 2014/0125371 A1* | 5/2014 | Chung ................. G01R 1/0408 |
| | | 324/756.03 |

* cited by examiner

COMMON TEST BOARD, IP EVALUATION BOARD, AND SEMICONDUCTOR DEVICE TEST METHOD

CROSS-REFERENCE TO RELATED APPLICATIONS

This application is a divisional of Application Ser. No. 14/991,747, filed Jan. 8, 2016 and is based upon and claims the benefit of priority from Japanese Patent Application No. 2015-049257, filed on Mar. 12, 2015; the entire contents of which are incorporated herein by reference.

FIELD

Embodiments described herein relate generally to a common test board, an IP evaluation board, and a semiconductor device test method.

BACKGROUND

Semiconductor devices are tested before the shipment. There is a need to reduce the cost of the test.

DETAILED DESCRIPTION

In general, according to one embodiment, there is provided a common test board including a socket board, an IP evaluation board, and a common board. To the socket board, a semiconductor device is to be connected. On the IP evaluation board, the socket board is able to be attached. On the common board, the IP evaluation board is able to be attached.

Exemplary embodiments of a common test board will be explained below in detail with reference to the accompanying drawings. The present invention is not limited to the following embodiments.

Embodiment

The common test board according to the embodiment will be described. The common test board is used to test a semiconductor device (LSI). The semiconductor device is tested before the shipment of the semiconductor device.

For example, a test (quality determination test) to determine whether the internal logic in the semiconductor device is broken is conducted with an LSI tester. The LSI tester includes channels and special measurement options. The number of channels is a certain common denominator among the numbers of signals that are required for models of semiconductor devices, respectively. A tester board is held on the LSI tester. The tester board is formed by an interface to which an LSI-dedicated socket for each model of semiconductor devices is connected. The semiconductor device is connected to and put on the LSI-dedicated socket. Subsequently, a test signal is input from the LSI tester to the semiconductor device, and is output from the semiconductor device to the LSI tester through the tester board and the LSI-dedicated socket. This input and output tests whether the internal logic in the semiconductor device is broken. The quality determination test includes, for example, a SCAN test or a built in self test (BIST).

An LSI tester used in a method of a quality determination test is configured for all purposes. Thus the number of channels (the number of test pins) of the LSI tester can be increased or decrease only by, for example, 32, 64, or 128. Thus, some models of semiconductor devices have many units of hardware (for example, test pins) that are not used on the tester board. Similarly, it may be impossible to easily remove the special measurement options implemented on the LSI tester. Thus, the unused special measurement options remain on the tester board when the semiconductor device is tested without the special measurement options. In other words, such a tester board sometime causes a wasteful cost of installing unused hardware or special measurement options on the tester board, and thus increases the cost of the test.

Furthermore, an LSI-dedicated socket for each model of semiconductor devices is connected to the tester board. Thus, different tester boards are required for various models of semiconductor devices to be tested, respectively. This causes the increase in cost of forming tester boards, and thus can increase the cost of the test.

Figure 3:
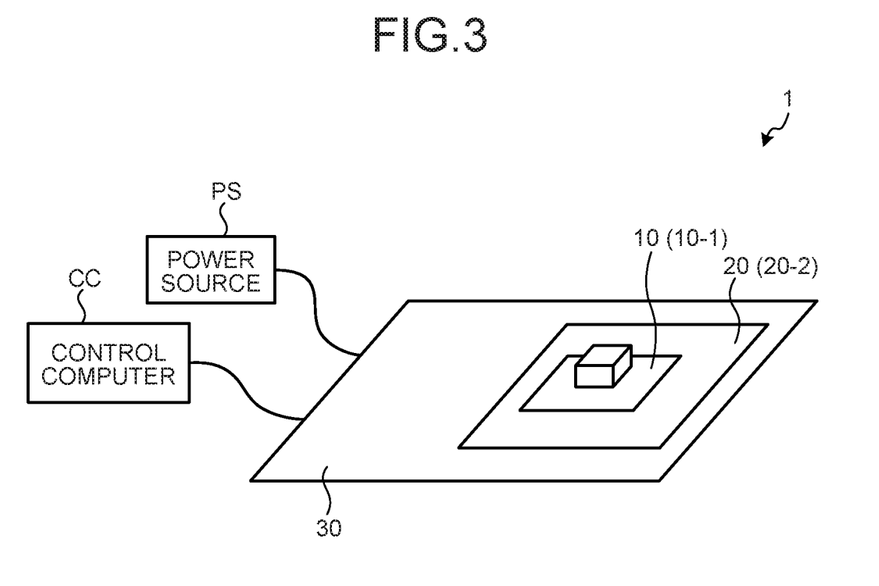
FIG. 3 is a diagram of the configuration of the common test board according to the embodiment.
Figure 4:
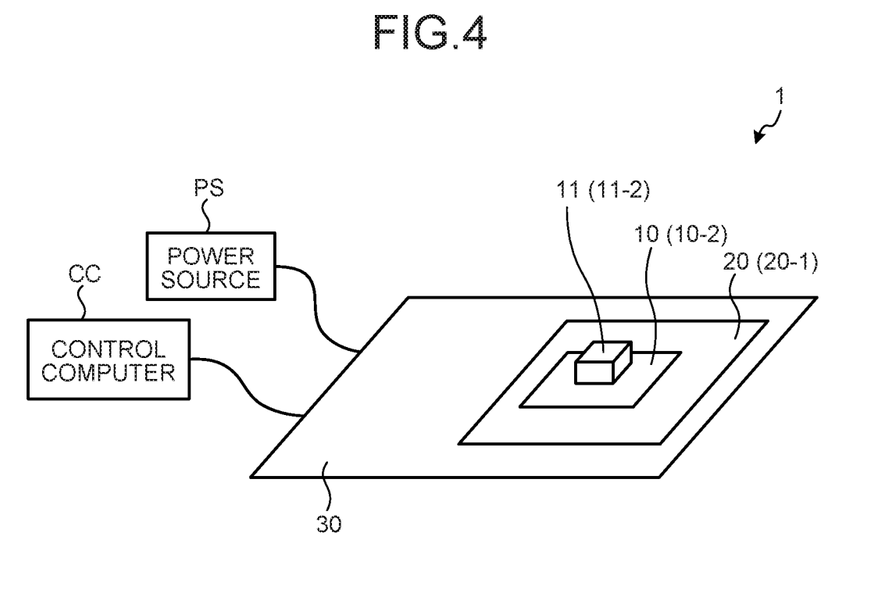
FIG. 4 is a diagram of the configuration of the common test board according to the embodiment.
Figure 5:
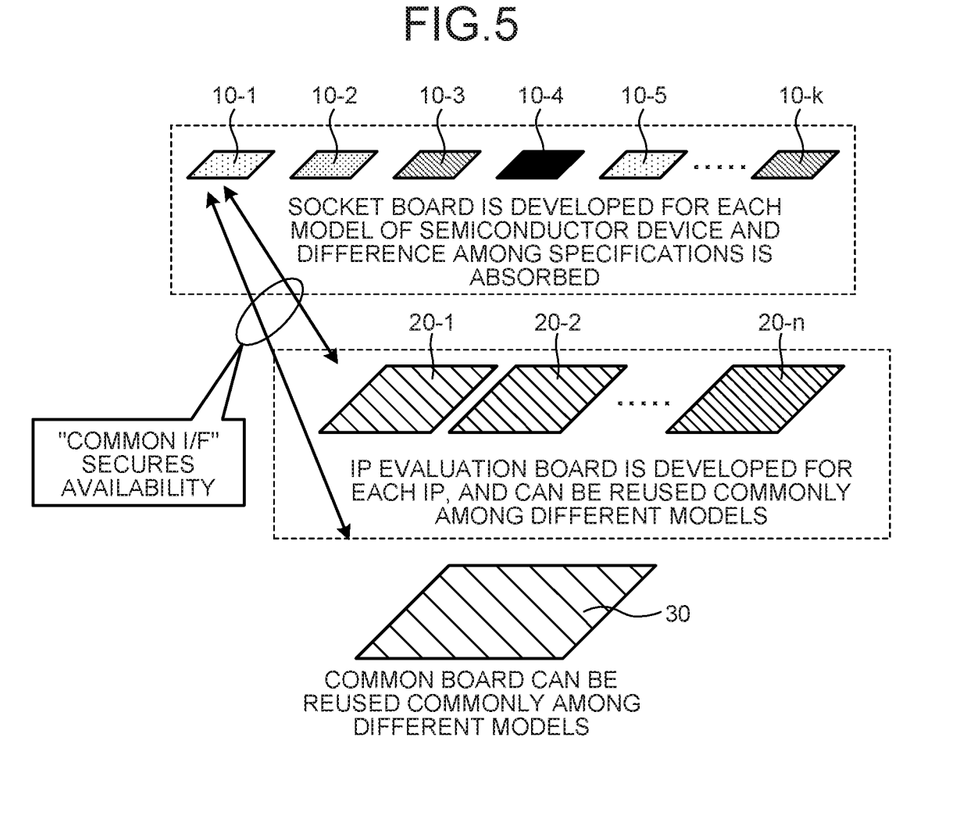
FIG. 5 is a diagram of the concept of commonalization of the common test board according to the embodiment.

In light of the foregoing, a common test board 1 is configured with a combination of a board that is configured to be used commonly among models of semiconductor devices and a board that is to be changed depending on the model of the semiconductor device to be tested as illustrated in FIGS. 1 to 5 in the present embodiment. This configuration is aimed at reducing the cost of testing semiconductor devices. FIGS. 1 to 4 are diagrams of the configuration of the common test board 1. FIG. 5 is a diagram of the concept of commonalization of the common test board 1.

Specifically, the common test board 1 includes a socket board 10, an IP evaluation board 20, and a common board 30.

The specifications (including the packaging form, and the number of pins in a package) of semiconductor devices are often different from each other depending on the model of the semiconductor device. An LSI-dedicated socket 11 needs to have the specifications (including the arrangement of the test pins and the number of test pins) varying depending on the model of the semiconductor device. Thus, a plurality of socket boards 10-1 to 10-$k$ ($k$ is an integer more than or equal to two) is prepared for semiconductor devices, respectively (see FIG. 5). The socket boards 10-1 to 10-$k$ differ from each other depending on the model of the semiconductor device. LSI-dedicated sockets 11-1 to 11-$k$ that have different specifications from each other are implemented on the socket boards 10-1 to 10-$k$. A socket board is selected among the socket boards 10-1 to 10-$k$ as a socket board 10 to be included in the common test board 1 in accordance with the model of the semiconductor device to be tested.

Figure 1:
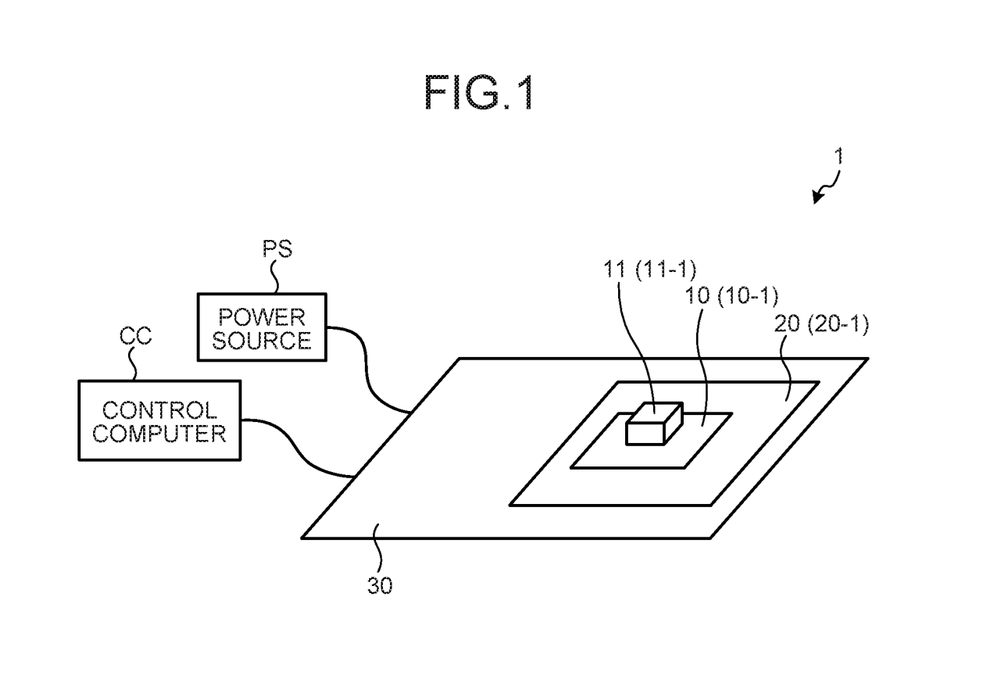
FIG. 1 is a diagram of the configuration of a common test board according to an embodiment.
Figure 2:
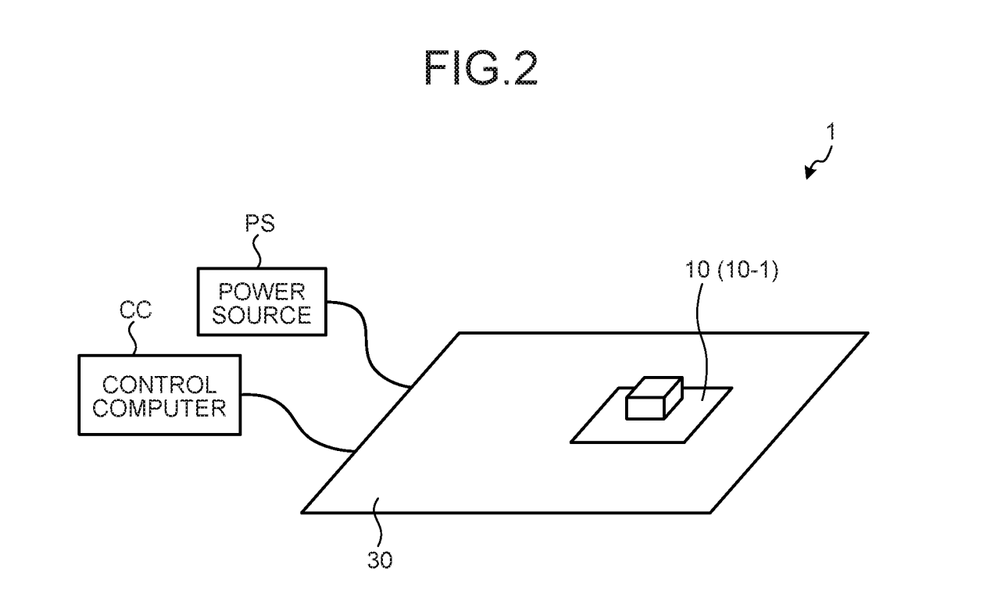
FIG. 2 is a diagram of the configuration of the common test board according to the embodiment.

For example, to test a semiconductor device SD-1, the socket board 10-1 is selected as the socket board 10 to be included in the common test board 1 as illustrated in FIGS. 1 to 3. Alternatively, for example, to test a semiconductor device SD-2, the socket board 10-2 is selected as the socket board 10 to be included in the common test board 1 as illustrated in FIG. 4.

Figure 9:
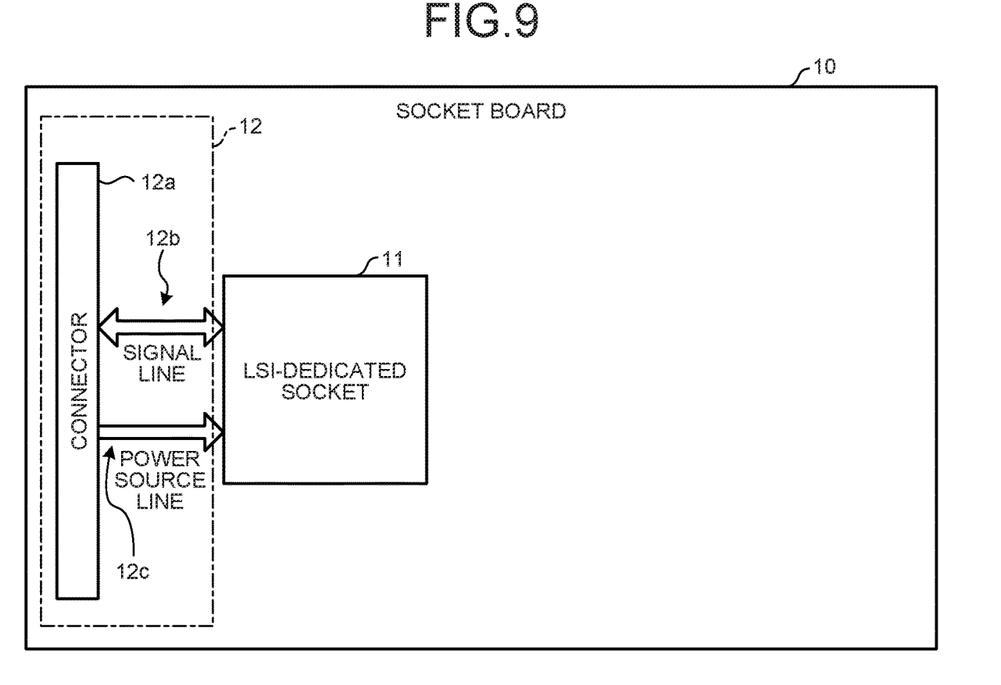
FIG. 9 is a diagram of the configuration of a socket board of the embodiment.

In the examples, interfaces 12-1 to 12-$k$ are provided on the socket boards 10-1 to 10-$k$, respectively, in order to absorb the difference among the specifications of the LSI-dedicated sockets 11-1 to 11-$k$ (see FIG. 9). In other words, the wiring from the LSI-dedicated socket 11 to a connector 12$a$ (for example, the wiring of the signal line 12$b$, or the wiring of the power source line 12$c$ illustrated in FIG. 9) is changed in each of the interfaces 12-1 to 12-$k$. This change absorbs the difference among the specifications of the LSI-dedicated sockets 11-1 to 11-$k$. Then, the connector 12$a$, which is to be connected to another board in each of the interfaces 12-1 to 12-$k$, is configured to be used commonly among the socket boards 10-1 to 10-$k$. The LSI-dedicated sockets 11-1 to 11-$k$ are electrically connected to the interfaces 12-1 to 12-$k$, respectively. This commonalization enables the other units in the common test board 1 to be used commonly among different models of semiconductor devices. This can reduce the number of channels (the number of test pins) necessary to test the basic device control and fundamental functions as the design of the semiconductor device.

For example, the common board 30 is commonly reused even after the model of the semiconductor device to be tested is changed (see FIG. 5). For example, to test either of the semiconductor device SD-1 (FIGS. 1 to 3) and the semiconductor device SD-2 (FIG. 4), the common board 30 is included in the common test board 1.

Figure 7:
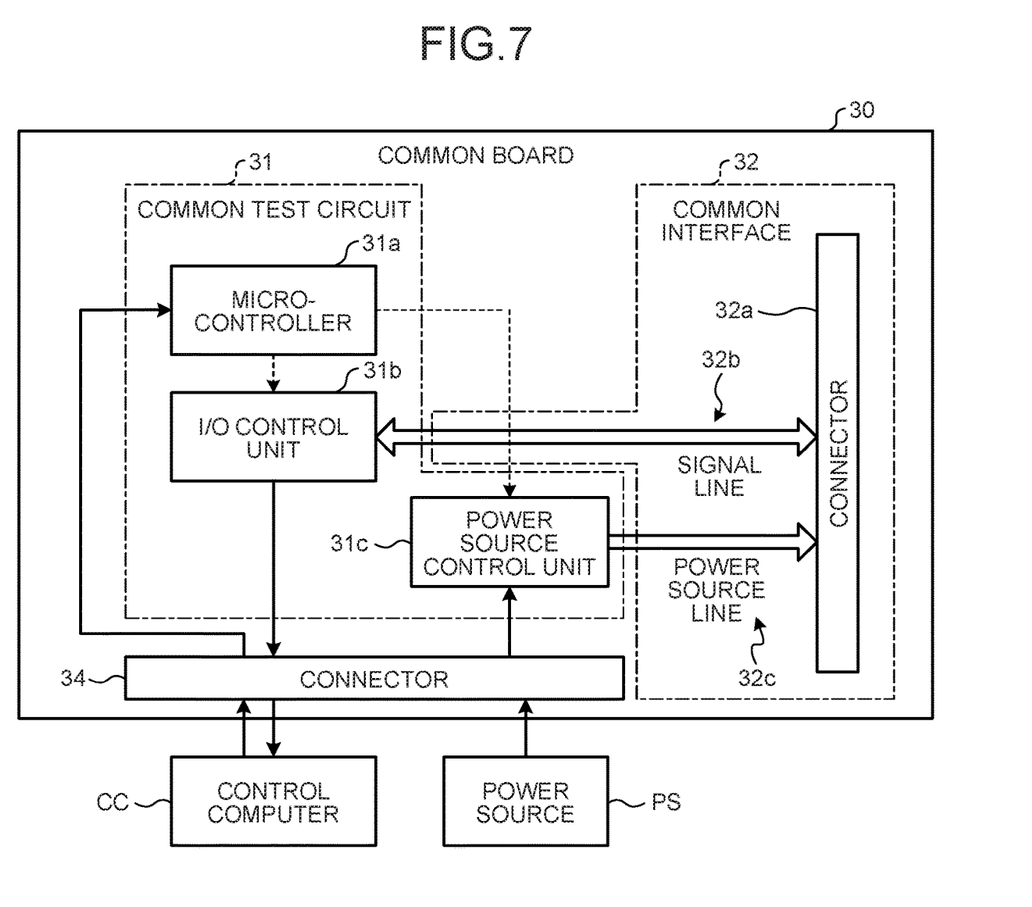
FIG. 7 is a diagram of the configuration of a common board of the embodiment.

The common board 30 includes a common test circuit 31 and a common interface 32 (see FIG. 7). The common test circuit 31 is electrically connected to the common interface 32. A power source PS and a control computer CC are externally connected to the common test circuit 31. Thus, the common test circuit 31 has a function to generate a test signal (for example, a clock or a test pattern) used for a quality determination test in accordance with the electric power source received from the power source PS and the request received from the control computer CC. This connection makes it unnecessary to use a general-purpose LSI tester. Thus, the number of signals necessary for a quality determination test is reduced and the common test circuit 31 can be commonly used. This can reduce the need to install unused hardware on the board.

Furthermore, in order to determine the contents of a test specific for semiconductor devices, it is necessary to consider that most semiconductor devices are designed based on the intellectual property (IP). In other words, an IP functional block is sometimes implemented on a semiconductor device. The IP functional block is a circuit block complying, for example, with the standard for universal serial buses (USBs), or high-definition multimedia interfaces (HDMIs) (registered trademark). The specifications of the IP functional blocks differ depending on the standard. Thus, different types of IP functional blocks need to be tested with different evaluation tests. Accordingly, a plurality of different IP evaluation boards 20-1 to 20-$n$ ($n$ is an integer more than or equal to two) from each other is prepared for the types of IP functional blocks, respectively. IP-test-dedicated circuits (evaluation signal generation circuits) 21-1 to 21-$n$ having different specifications from each other are implemented on the IP evaluation boards 20-1 to 20-$n$. An IP evaluation board is selected as the IP evaluation board 20 to be included in the common test board 1 among the IP evaluation boards 20-1 to 20-$n$ in accordance with the type of the IP functional block implemented on the semiconductor device to be tested. The common test circuit 31 has a function to generate a control signal used for an IP evaluation test in accordance with the electric power source received from the power source PS and the request received from the control computer CC. Each of the IP-test-dedicated circuits 21-1 to 21-$n$ has a function to generate a test signal (for example, a clock or a test pattern) used for an IP evaluation test in accordance with the control signal for the IP evaluation test.

For example, to test an IP functional block BLK1 implemented on the semiconductor device SD-1 or SD-2, the IP evaluation board 20-1 is selected as the IP evaluation board 20 to be included in the common test board 1 as illustrated in FIGS. 1 and 4. Alternatively, for example, to test an IP functional block BLK2 implemented on the semiconductor device SD-1, the IP evaluation board 20-2 is selected as the IP evaluation board 20 to be included in the common test board 1 as illustrated in FIG. 3.

At this time, interfaces 22-1 to 22-$n$ and interfaces 23-1 to 23-$n$ are provided on the IP evaluation boards 20-1 to 20-$n$, respectively, in order to absorb the difference among the specifications of the IP-test-dedicated circuits 21-1 to 21-$n$. In other words, the wiring from any one of the IP-test-dedicated circuits 21-1 to 21-$n$ to a connector 22$a$ (for example, the wiring of the signal line 22$b$, or the wiring of the power source line 22$c$ illustrated in FIG. 8) is changed in each of the interfaces 22-1 to 22-$n$. Meanwhile, the wiring from any one of the IP-test-dedicated circuits 21-1 to 21-$n$ to a connector 23$a$ (for example, the wiring of the signal line 23$b$, or the wiring of the power source line 23$c$ illustrated in FIG. 8) is changed in each of the interfaces 23-1 to 23-$n$. These changes absorb the difference among the specifications of the IP-test-dedicated circuits 21-1 to 21-$n$.

Figure 6A:
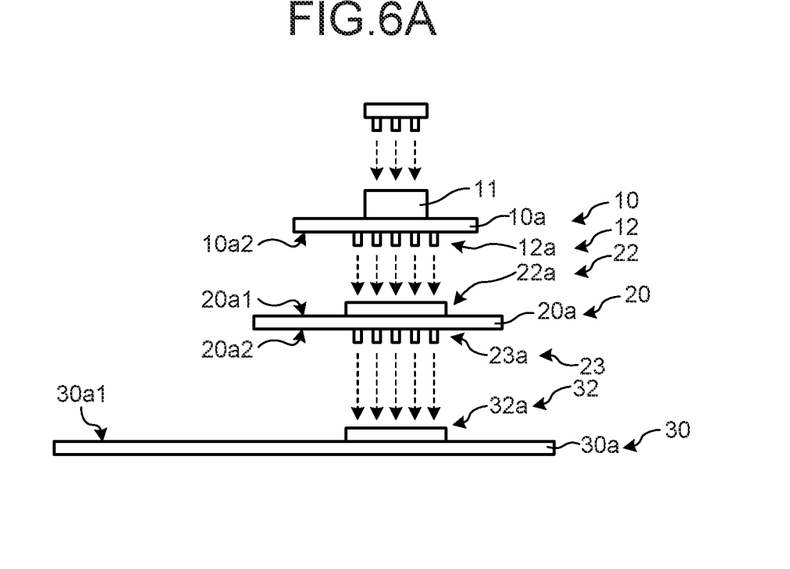
FIGS. 6A and 6B are diagrams of the shape of connectors of the embodiment.

Then, the connector 22$a$, which is to be connected to any one of the socket boards 10-1 to 10-$k$ in each of the interfaces 22-1 to 22-$n$, is used commonly among the IP evaluation boards 20-1 to 20-$n$. The connector 22$a$ in each of the interfaces 22-1 to 22-$n$ has the configuration corresponding to the configuration of the connector 12$a$ in each of the interfaces 12-1 to 12-$k$. Both of the connector 22$a$ and the connector 12$a$ can be fit with each other. For example, pins of the connector 12$a$ can be fit with holes of the connector 22$a$ as illustrated in FIG. 6A. FIG. 6A is a diagram of the shape of each of the connectors in the common test board 1. The connector 22$a$ can be placed on a front surface 20$a$1 of a substrate 20$a$. This placement enables the different socket boards 10-1 to 10-$k$ to be held on the common interfaces 22-1 to 22-$n$.

A connector 23$a$, which is to be connected to the common board 30 in each of the interfaces 23-1 to 23-$n$ (see FIG. 8), is used commonly among the IP evaluation boards 20-1 to 20-$n$. The connector 23$a$ in each of the interfaces 23-1 to 23-$n$ has the configuration corresponding to the configuration of a connector 32$a$ in the common interface 32. Both of the connector 23$a$ and the connector 32$a$ can be fit with each other. For example, pins of the connector 23$a$ can be fit with holes of the connector 32$a$ as illustrated in FIG. 6A. The connector 23$a$ can be placed on a reverse surface 20$a$2 of the substrate 20a. This placement enables any one of the interfaces 23-1 to 23-n to be held on the common board 30.

Note that the IP functional block is not implemented on some models of semiconductor devices. Alternatively, if an IP functional block is implemented on a semiconductor device, it may be necessary to omit the evaluation test for the IP functional block. In light of the foregoing, flexibility is given to the configuration of the common test board 1 such that the common test board 1 can be configured without any one of the IP evaluation boards 20-1 to 20-n.

For example, to omit to test the IP functional block BLK1 or BLK2 implemented on the semiconductor device SD-1, the socket board 10-1 is held on the common board 30 as illustrated in FIG. 2 and the common test board 1 is configured with the socket board 10-1 and the common board 30.

Figure 6B:
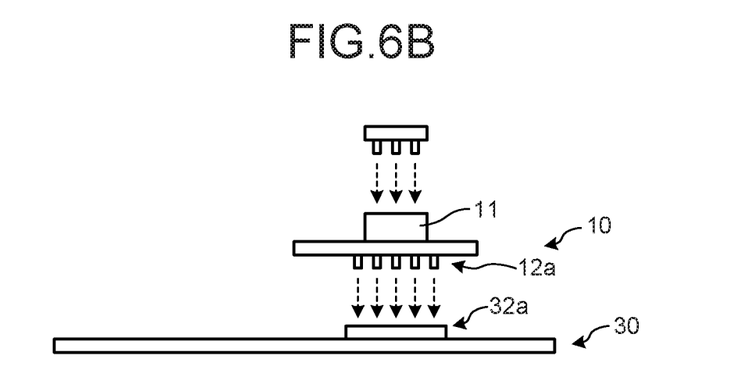

At this time, the connector 32a in the common interface 32 has the configuration corresponding not only to the configuration of the connector 23a in each of the interfaces 23-1 to 23-n but also to the configuration of the connector 12a in each of the interfaces 12-1 to 12-k. Both of the connector 32a and the connector 12a can be fit with each other. For example, pins of the connector 12a can be fit with holes of the connector 32a as illustrated in FIG. 6B. This enables any of the socket boards 10-1 to 10-k can be fit with the common board 30 without any of the IP evaluation boards 20-1 to 20-n therebetween.

It is further necessary to conduct a test to determine whether a semiconductor device can exert the required performance when the semiconductor device is implemented on an actual apparatus (an actual apparatus test). For example, when the semiconductor device is an image processing chip for a television, the semiconductor device is implemented on a television and tested whether to display an appropriate image on the screen of the television. Alternatively, for example, when the semiconductor device is an AV chip, the semiconductor device is implemented on an AV apparatus and tested whether to play an appropriate voice or video. Alternatively, for example, when the semiconductor device is an image sensor chip, the semiconductor device is implemented on a mobile terminal and tested whether to take an appropriate image. Alternatively, for example, when the semiconductor device is a display control chip, the semiconductor device is implemented on a mobile terminal and tested whether to display an appropriate image on the LCD device of the mobile terminal.

For such tests, a common test circuit 31 on the common board 30 (see FIG. 7) has a function to generate a test signal (for example, a clock or a test pattern) used for such an actual apparatus test in accordance with the electric power source received from the power source PS and the request received from the control computer CC. The common test circuit 31 has also a function to control the test mode such that the common test board 1 operates in a mode selected among a quality determination test mode, an IP evaluation test mode, and an actual apparatus test mode.

Figure 8:
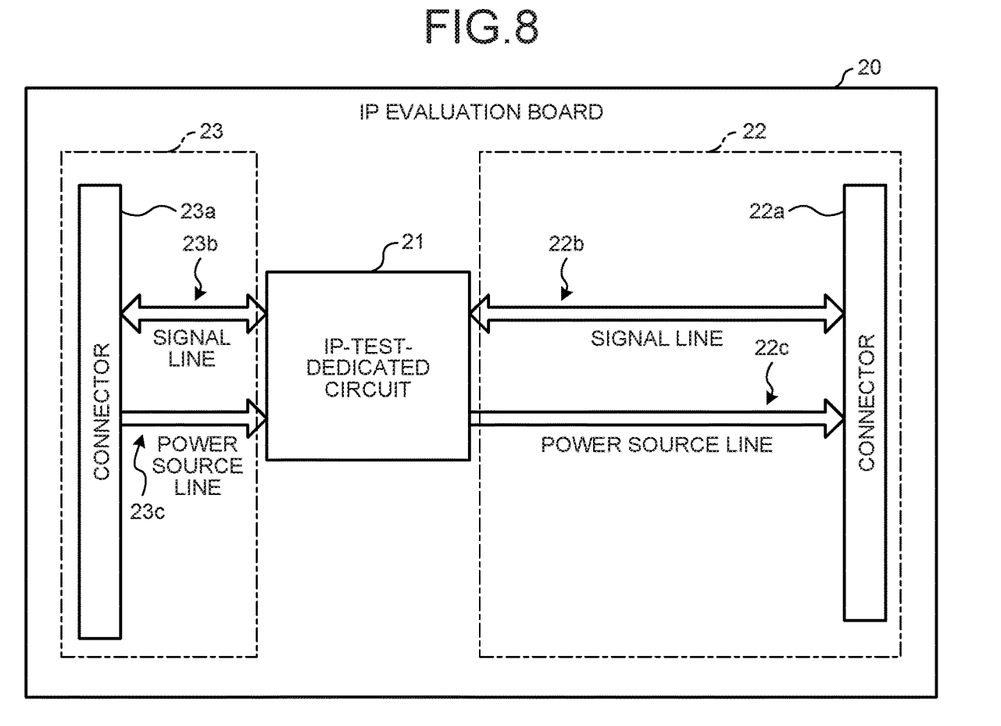
FIG. 8 is a diagram of the configuration of an IP evaluation board of the embodiment.

The configuration of each of the boards will be described next with reference to FIGS. 7 to 9. FIG. 7 is a diagram of the configuration of a common board. FIG. 8 is a diagram of the configuration of an IP evaluation board. FIG. 9 is a diagram of the configuration of a socket board.

The common board 30 includes the common test circuit 31 and the common interface 32. The common test circuit 31 includes a microcontroller 31a, an I/O control unit 31b, and a power source control unit 31c. The microcontroller 31a receives a request from the control computer CC through the connector 34, and controls the I/O control unit 31b and the power source control unit 31c in response to the request. The microcontroller 31a inputs a test signal of a quality determination test or an actual apparatus test to the common interface 32, and outputs the test signal from the common interface 32 through the I/O control unit 31b. The microcontroller 31a provides a control signal used for an IP evaluation test to the common interface 32 through the I/O control unit 31b in response to the request from the control computer CC. The power source control unit 31c adjusts the electric power source received from the power source PS through the connector 34 such that the electric power source is internally used in response to the control signal from the microcontroller 31a. The power source control unit 31c supplies the electric power source to internally be used to the common interface 32.

The common interface 32 includes the connector 32a, the signal line 32b, and the power source line 32c. The signal line 32b electrically connects the I/O control unit 31b to the connector 32a. The power source line 32c electrically connects the power source control unit 31c to the connector 32a. The connector 32a can be placed on a front surface 30a1 of a substrate 30a in the common board 30 (see FIG. 6A).

The IP evaluation board 20 includes the IP-test-dedicated circuit (evaluation signal generation circuit) 21, the interface 22, and the interface 23. The IP-test-dedicated circuit 21 generates a test signal (for example, a clock or a test pattern) used for an IP evaluation test in accordance with the control signal for the IP evaluation test received from the common test circuit 31 through the common interface 32 and the interface 23. The IP-test-dedicated circuit 21 inputs the test signal of the IP evaluation test to the semiconductor device and outputs the test signal from the semiconductor device through the interface 22 and the socket board 10. The IP-test-dedicated circuit 21 transfers the test signal used for a quality determination test or the test signal used for an actual apparatus test between the interface 22 and the interface 23. The IP-test-dedicated circuit 21 transfers the electric power source to internally be used from the interface 22 to the interface 23.

The interface 22 includes the connector 22a, the signal line 22b, and the power source line 22c. The signal line 22b electrically connects the IP-test-dedicated circuit 21 to the connector 22a. The power source line 22c electrically connects the IP-test-dedicated circuit 21 to the connector 22a. The connector 22a can be placed on the front surface 20a1 of the substrate 20a in the IP evaluation board 20 (see FIG. 6A).

The interface 23 includes the connector 23a, the signal line 23b, and the power source line 23c. The signal line 23b electrically connects the IP-test-dedicated circuit 21 to the connector 23a. The power source line 23c electrically connects the IP-test-dedicated circuit 21 to the connector 23a. The connector 23a can be placed on the reverse surface 20a2 of the substrate 20a in the IP evaluation board 20 (see FIG. 6A).

The socket board 10 includes the LSI-dedicated socket 11 and the interface 12. The pins of the package of the semiconductor device are electrically connected to the LSI-dedicated socket 11. The LSI-dedicated socket 11 inputs a test signal to the semiconductor device and outputs the test signal from the semiconductor device through the interface 12.

The interface 12 includes the connector 12a, the signal line 12b, and the power source line 12c. The signal line 12b electrically connects the LSI-dedicated socket 11 to the connector 12a. The power source line 12c electrically connects the LSI-dedicated socket 11 to the connector 12a. The connector 12a can be placed on the reverse surface 10a2 of the substrate 10a in the socket board 10 (see FIG. 6A).

Figure 10:
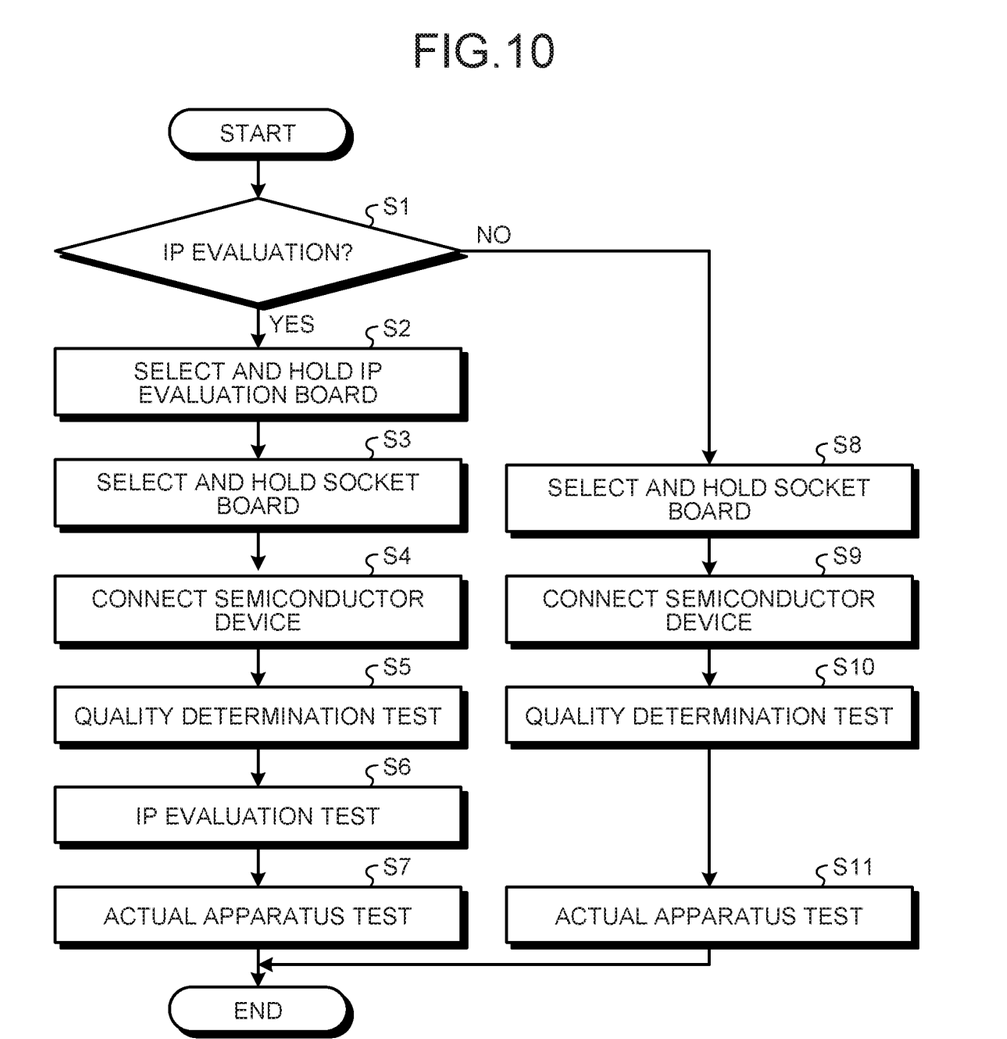
FIG. 10 is a flowchart of a semiconductor device test method of the embodiment.

The semiconductor device test method will be descried next with reference to FIG. 10. FIG. 10 is a flowchart of the semiconductor device test method.

When an instruction for a test including IP evaluation is input (Yes in S1), the control computer CC sets the schedule for the test in order of a quality determination test→an IP evaluation test→an actual apparatus test. The instruction for a test includes the information about the model of the semiconductor device to be tested and the type of the IP functional block to be tested.

An IP evaluation board is selected among the IP evaluation boards 20-1 to 20-n in accordance with the type of the IP functional block to be tested. The selected IP evaluation board 20 is held on the common board 30 (S2). A socket board is selected among the socket boards 10-1 to 10-k in accordance with the model of the semiconductor device to be tested. The selected socket board 10 is held on the IP evaluation board 20 (S3). The semiconductor device is connected to the LSI-dedicated socket 11 on the socket board 10 held in S3 (S4).

The control computer CC provides the request for the quality determination test to the common test circuit 31 on the common board 30. The common test circuit 31 conducts a quality determination test to test the semiconductor device in response to the request for the quality determination test (S5). In other words, the common test circuit 31 inputs a test signal of the quality determination test to the semiconductor device and outputs the test signal from the semiconductor device through the common interface 32, the IP evaluation board 20, and the socket board 10.

The control computer CC provides the request for the IP evaluation test to the common test circuit 31 on the common board 30. The common test circuit 31 controls the common test board to conduct an IP evaluation test to test the semiconductor device in response to the request for the IP evaluation test (S6). In other words, the common test circuit 31 provides the control signal for the IP evaluation test to the IP-test-dedicated circuit 21 through the common interface 32 and the interface 23. The control signal for the IP evaluation test includes the information about the type of the IP functional block to be tested. The IP-test-dedicated circuit 21 generates a test signal used for the IP evaluation test, inputs the test signal to the semiconductor device and outputs the test signal from the semiconductor device through the interface 22 and the socket board 10 in response to the control signal of the IP evaluation test.

The control computer CC provides the request for the actual apparatus test to the common test circuit 31 on the common board 30. The common test circuit 31 conducts an actual apparatus test to test the semiconductor device in response to the request for the actual apparatus test (S7). In other words, the common test circuit 31 inputs the test signal of the actual apparatus test to the semiconductor device and outputs the test signal from the semiconductor device through the common interface 32, the IP evaluation board 20, and the socket board 10.

On the other hand, when an instruction for a test without IP evaluation is input (No in S1), the control computer CC sets the schedule for the test in order of a quality determination test→an actual apparatus test. The instruction for the test includes the information about the model of the semiconductor device to be tested.

A socket board is selected among the socket boards 10-1 to 10-k in accordance with the model of the semiconductor device to be tested. The selected socket board 10 is held on the common board 30 (S8). The semiconductor device is connected to the LSI-dedicated socket 11 on the socket board 10 held in S8 (S9).

The control computer CC provides the request for the quality determination test to the common test circuit 31 on the common board 30. The common test circuit 31 conducts a quality determination test to test the semiconductor device in response to the request for the quality determination test (S10). In other words, the common test circuit 31 inputs the test signal of the quality determination test to the semiconductor device and outputs the test signal from the semiconductor device through the common interface 32, and the socket board 10.

The control computer CC provides the request for the actual apparatus test to the common test circuit 31 on the common board 30. The common test circuit 31 conducts an actual apparatus test to test the semiconductor device in response to the request for the actual apparatus test (S11). In other words, the common test circuit 31 inputs the test signal of the actual apparatus test to the semiconductor device and outputs the test signal from the semiconductor device through the common interface 32, the IP evaluation board 20, and the socket board 10.

As described above, in the embodiment, the common board 30 is configured to be used commonly among models of semiconductor devices. The IP evaluation board 20 is changed depending on the IP functional block to be tested. The socket board 10 is changed depending on the model of the semiconductor device to be tested. The common test board 1 is formed by the combination of the common board 30, the IP evaluation board 20, and the socket board 10. Thus, if the model of the semiconductor device to be tested is changed, the common board 30 can commonly be reused. This can diminish or reduce the number of channels (the number of test pins) necessary for the test. As a result, the cost of testing the semiconductor device can be reduced.

Furthermore, in the embodiment, the socket board 10 can be held on the common board 30 without the IP evaluation board 20 therebetween. This can improve the flexibility to change the configuration of the common test board 1 depending on the requested contents of the test.

Furthermore, in the embodiment, each of the socket boards 10-1 to 10-k includes the connector 12a that is electrically connected to any one of the different LSI-dedicated sockets 11-1 to 11-k from each other, and is configured to be used commonly among the socket boards 10-1 to 10-k. This enables the socket board 10 to absorb the difference among the packages, or among the single connections. The package and signal connection vary depending on the model of the semiconductor device. The units other than the socket board 10 in the common test board 1 can commonly be used among different models of semiconductor devices.

Furthermore, in the embodiment, the common test circuit 31 on the common board 30 has a function to generate a test signal (for example, a clock or a test pattern) used for a quality determination test. The function makes it unnecessary to use a general-purpose LSI tester. Thus, the number of signals necessary for a quality determination test is reduced and the common test circuit 31 can commonly be used. This can reduce the need to install the hardware that is not to be used on the board.

Furthermore, in the embodiment, the common test circuit 31 on the common board 30 can generate any of the test signal used for the quality determination test, the control signal used for the IP evaluation test, and the test signal used for the actual apparatus test. Thus, a test that is not conducted with a general-purpose LSI tester (for example, an IP evaluation test or an actual apparatus test) can be conducted with the common test board 1 used commonly for a quality determination test. As a result, different types of tests can sequentially be conducted on the common test board 1. The total time required to conduct the different types of tests can be shortened and thus the total cost of the tests can be reduced.

Figure 11:
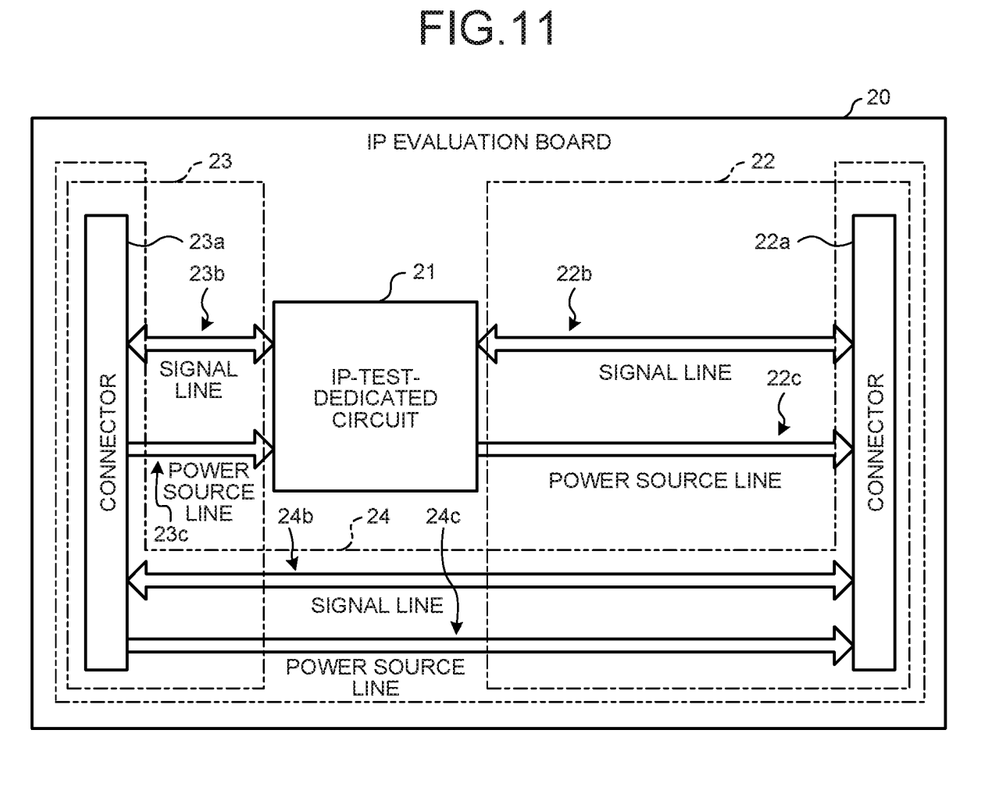
FIG. 11 is a diagram of the configuration of an IP evaluation board of an exemplary variation of the embodiment.

Note that a signal line 24b and a power source line 24c that bypass the IP-test-dedicated circuit 21 can be provided on the IP evaluation board 20 as illustrated in FIG. 11. In other words, an IP evaluation board 20i further includes an interface 24. The interface 24 includes a connector 22a, a connector 23a, the signal line 24b, and the power source line 24c. The signal line 24b electrically connects the connector 22a to the connector 23a. The power source line 24c electrically connects the connector 22a to the connector 23a. These connections make it unnecessary to make the IP-test-dedicated circuit 21 have a function to transfer test signals and the power source internally used, and thus can simplify the configuration of the IP-test-dedicated circuit 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A common test board comprising:
a socket board to which a semiconductor device is to be connected;
an IP evaluation board on which the socket board is attached; and
a common board on which the IP evaluation board is attached,
wherein the common board includes:
a common interface on which different IP evaluation board used to evaluate different IP function block is attached; and
a common test circuit electrically connected to the common interface, the common test circuit generating any of signals of a quality determination test, an IP evaluation test, and an actual apparatus test, the quality determination test being a test to determine quality of the semiconductor device, the IP evaluation test being a test to evaluate a IP function block implemented on the semiconductor device, the actual apparatus test being a test to check whether the semiconductor device can exert required performance in an actual apparatus.

2. The common test board according to claim 1, wherein the common interface is an interface on which the socket board with different specification is attached.

3. The common test board according to claim 1, wherein the IP evaluation board includes:
an evaluation signal generation circuit;
a second interface electrically connected to the evaluation signal generation circuit, the second interface including a second connector, the second interface being an interface on which different socket board is attached; and
a third interface electrically connected to the evaluation signal generation circuit, the third interface including a third connector, third interface being attached on the common interface.

4. The common test board according to claim 3, wherein the IP evaluation board further includes
a fourth interface that is not electrically connected to the evaluation signal generation circuit, the fourth interface including the second connector and the third connector, the fourth interface being an interface on which different socket board is attached, the fourth interface being attached on the common interface.

5. The common test board according to claim 1, wherein the first interface further includes
a first signal line that connects the socket to the first connector, and
a first power line that connects the socket to the first connector.

6. The common test board according to claim 3, wherein the second interface further includes
a second signal line that connects the evaluation signal generation circuit to the second connector, and
a second power line that connects the evaluation signal generation circuit to the second connector,
the third interface further includes
a third signal line that connects the evaluation signal generation circuit to the third connector, and
a third power line that connects the evaluation signal generation circuit to the third connector.

7. The common test board according to claim 6, wherein the IP evaluation board further includes
a fourth interface that is not electrically connected to the evaluation signal generation circuit, the fourth interface being an interface on which different socket board is attached, the fourth interface being able to be attached on the common interface,
wherein the fourth interface includes
the second connector,
the third connector,
a fourth signal line that connects the second connector to the third connector, and
a fourth power line that connects the second connector to the third connector.

8. The common test board according to claim 1, wherein the common interface includes a fourth connector that is configured to be able to be fit with the first connector.

9. The common test board according to claim 3, wherein the second connector is configured to be fit with the first connector, and
the common interface includes a fourth connector that is configured to be able to be fit with the third connector.

10. The common test board according to claim 3, wherein the common interface includes a fourth connector that is configured to be fit with any of the first connector and the third connector, and
the second connector is configured to be fit with the first connector.

11. The common test board according to claim 1, wherein the common test circuit generates any of signals of a quality determination test and an actual apparatus test, the quality determination test being a test to determine quality of the semiconductor device, the actual apparatus test being a test to check whether the semiconductor device can exert required performance in an actual apparatus, and
the common test circuit inputs the test signal to the semiconductor device and outputs the test signal from the semiconductor device through at least the common interface and the socket board.

12. The common test board according to claim 3, wherein the evaluation signal generation circuit generates a signal of an IP evaluation test, the IP evaluation test being a test to evaluate a IP function block implemented on the semiconductor device, and the evaluation signal generation circuit inputs the test signal to the semiconductor device and outputs the test signal from the semiconductor device through the second interface and the socket board.

13. The common test board according to claim 1, wherein the common interface is an interface on which the IP evaluation board is attached or on which the socket board is attached, the socket board is attached on the common board without the IP evaluation board therebetween.

14. The common test board according to claim 1, wherein the socket board includes:

a socket to which the semiconductor device is connected; and a first interface electrically connected to the socket and including a first connector.

\* \* \* \* \*